US009336123B1

(12) United States Patent
Lamant et al.

(10) Patent No.: US 9,336,123 B1
(45) Date of Patent: May 10, 2016

(54) METHOD AND SYSTEM FOR AUTOMATICALLY ESTABLISHING A COMPONENT DESCRIPTION FORMAT (CDF) DEBUGGING ENVIRONMENT

(71) Applicants: Gilles S. C. Lamant, Sunnyvale, CA (US); Li-Chien Ting, Cupertino, CA (US); Serena Chiang Caluya, Pleasanton, CA (US); Chia-Fu Chen, Cupertino, CA (US)

(72) Inventors: Gilles S. C. Lamant, Sunnyvale, CA (US); Li-Chien Ting, Cupertino, CA (US); Serena Chiang Caluya, Pleasanton, CA (US); Chia-Fu Chen, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/230,022

(22) Filed: Mar. 31, 2014

Related U.S. Application Data

(62) Division of application No. 13/396,119, filed on Feb. 14, 2012.

(51) Int. Cl.
*G06F 9/44* (2006.01)
*G06F 11/36* (2006.01)

(52) U.S. Cl.
CPC .................................. *G06F 11/3636* (2013.01)

(58) Field of Classification Search
None
See application file for complete search history.

(56) References Cited

U.S. PATENT DOCUMENTS

| | | | |
|---|---|---|---|
| 5,546,562 A * | 8/1996 | Patel ................................ 703/14 |
| 5,592,392 A * | 1/1997 | Matheson et al. ............ 716/119 |
| 5,640,542 A * | 6/1997 | Whitsel et al. ................... 703/28 |
| 6,182,258 B1 * | 1/2001 | Hollander ....................... 714/739 |
| 6,587,995 B1 * | 7/2003 | Duboc et al. ................... 716/106 |
| 6,654,949 B1 * | 11/2003 | Fraenkel ............. G06F 11/3466 717/127 |
| 6,708,326 B1 * | 3/2004 | Bhattacarya ................... 717/124 |
| 7,185,293 B1 * | 2/2007 | Ofer ................................ 326/38 |
| 7,296,259 B2 * | 11/2007 | Betker ................ G06F 11/3648 717/129 |
| 7,383,539 B2 * | 6/2008 | Bates .................. G06F 11/3644 717/127 |
| 7,519,960 B2 * | 4/2009 | Mei et al. ....................... 717/129 |
| 7,818,623 B2 * | 10/2010 | Sengupta ............ G06F 11/3632 717/129 |

(Continued)

OTHER PUBLICATIONS

Ciranova, "Ciranova PyCell Studio Tutorial"; 2008, Ciranova, Inc., [retrieved on Apr. 9, 2015]; Retrieved from Internet <URL:http://wiki.libun.xyz/old/various/imag/pycell_studio_tutorial.pdf>;pp. 1-18.*

(Continued)

*Primary Examiner* — Xi D Chen
(74) *Attorney, Agent, or Firm* — Rosenberg, Klein & Lee

(57) ABSTRACT

A system and method are provided for establishing an automated debugging environment in an Electronic Design Automation (EDA) work flow. A user interface is provided for interfacing with a user by displaying a list of debuggable parameters, accepting a selection thereof from a user, and automatically locating both the callback function which sets the selected parameter, and the source code file which contains the callback function. Additionally, it is determined whether the callback function sets solely the selected parameter, or several different parameters, and an automatic breakpoint is set accordingly to break only responsive to the selected parameter. On execution of the modified callback function, execution will be arrested by the automatically-set intelligent breakpoint and a debugging user interface will be generated and provided to the user with a display of the relevant source code, callback function, parameter names and values, system state, and the like. Upon completion of the debugging process, the automatically-set breakpoint will be removed or modified to remove the automatically-set portion of the breakpoint.

9 Claims, 16 Drawing Sheets

(56) References Cited

U.S. PATENT DOCUMENTS

| | | | |
|---|---|---|---|
| 7,840,845 B2 * | 11/2010 | Doddapaneni | G06F 11/2236 717/129 |
| 7,950,001 B2 * | 5/2011 | Panchamukhi | G06F 11/3644 717/127 |
| 8,046,730 B1 * | 10/2011 | Ferguson et al. | 716/139 |
| 8,347,261 B2 * | 1/2013 | Ginetti et al. | 716/139 |
| 8,370,786 B1 | 2/2013 | Burstein | |
| 8,429,622 B2 * | 4/2013 | Nanjundaswamy | G06F 11/362 717/129 |
| 8,499,270 B1 * | 7/2013 | Best et al. | 716/117 |
| 8,589,881 B2 * | 11/2013 | Park | G06F 11/3664 717/127 |
| 8,719,745 B2 * | 5/2014 | Ting et al. | 716/111 |
| 8,726,209 B1 * | 5/2014 | Lamant et al. | 716/111 |
| 8,843,861 B2 * | 9/2014 | Selvidge | 716/102 |
| 8,868,397 B2 * | 10/2014 | Alexanian et al. | 703/16 |
| 2002/0059054 A1 * | 5/2002 | Bade et al. | 703/20 |
| 2002/0120918 A1 * | 8/2002 | Aizenbud-Reshef | G06F 8/34 717/127 |
| 2003/0154463 A1 * | 8/2003 | Betker | G06F 11/362 717/129 |
| 2004/0049712 A1 * | 3/2004 | Betker | G06F 11/3648 717/124 |
| 2004/0205720 A1 * | 10/2004 | Hundt | G06F 11/3644 717/124 |
| 2005/0071820 A1 * | 3/2005 | Srinivas et al. | 717/129 |
| 2005/0268268 A1 | 12/2005 | Wang et al. | |
| 2005/0289396 A1 * | 12/2005 | Hooper et al. | 714/34 |
| 2006/0041867 A1 * | 2/2006 | Bates et al. | 717/129 |
| 2006/0064677 A1 * | 3/2006 | Bickson et al. | 717/124 |
| 2006/0101405 A1 * | 5/2006 | Buschardt et al. | 717/124 |
| 2007/0083813 A1 * | 4/2007 | Lui et al. | 715/709 |
| 2007/0150866 A1 * | 6/2007 | Bates | G06F 11/3624 717/124 |
| 2007/0168994 A1 * | 7/2007 | Barsness et al. | 717/129 |
| 2007/0220334 A1 * | 9/2007 | Pedersen et al. | 714/30 |
| 2008/0307392 A1 * | 12/2008 | Racca et al. | 717/120 |
| 2009/0089756 A1 * | 4/2009 | Danton | G06F 11/3664 717/124 |
| 2009/0150870 A1 * | 6/2009 | Bates | 717/129 |
| 2010/0287519 A1 * | 11/2010 | Su | 716/10 |
| 2011/0055815 A1 * | 3/2011 | Squillace | 717/125 |
| 2011/0219217 A1 * | 9/2011 | Sixsou et al. | 712/227 |
| 2011/0252404 A1 * | 10/2011 | Park et al. | 717/124 |
| 2012/0102460 A1 * | 4/2012 | Bates | G06F 11/362 717/124 |
| 2012/0102469 A1 * | 4/2012 | Kapoor et al. | 717/129 |
| 2013/0014088 A1 * | 1/2013 | Park et al. | 717/128 |

OTHER PUBLICATIONS

Copperman, "Debugging Optimized Code Without Being Misled", 1994 ACM; [retrieved on Mar. 15, 2016]; Retrieved from Internet <URL:http://dl.acm.org/citation.cfm?id=177517>;pp. 387-427.*

Fairley, "ALADDIN: Assembly Language Assertion Driven Debugging Interpreter"; 1979 IEEE; [retrieved on Mar. 15, 2016]; Retrieved from Internet <URL:http://ieeexplore.ieee.org/stamp/stamp.jsp?tp=&arnumber=1702647>;pp. 426-428.*

Auguston, et al., "A Debugger and Assertion Checker for the Awk Programming Language"; 1996 IEEE; [retrieved on Mar. 15, 2016]; Retrieved from Internet <URL:http://ieeexplore.ieee.org/stamp/stamp.jsp?tp=&arnumber=534006>;pp. 242-249.*

* cited by examiner

METHOD AND SYSTEM FOR AUTOMATICALLY ESTABLISHING A COMPONENT DESCRIPTION FORMAT (CDF) DEBUGGING ENVIRONMENT

This application is a Divisional patent application of co-pending application Ser. No. 13/396,119, filed on 14 Feb. 2012, now pending. The entire disclosure of the prior application Ser. No. 13/396,119, is considered a part of the disclosure of the accompanying Divisional application and is hereby incorporated by reference.

BACKGROUND OF THE INVENTION

The subject system and method are generally directed to automatically establishing a user-friendly, efficient, and effective debugging environment for electronic design automation (EDA) software environments. The system and method provide automated measures for interacting with a developer, automatically locating both a source file and a specific callback function to be debugged responsive to a developer merely selecting a parameter. The system and method automatically map and determine which source file and which callback function are implicated by the indicated parameter. Once the correct callback function and source code files are located, automatic break points may be set to provide a debugging environment for the user with merely the indication of the single parameter. The system and method thereby enable and provide an automated debugging environment for process design kit (PDK), Open PDK, interoperable PDK (iPDK), and/or PCell library/Pycell library development. The system may indeed be employed to enable and facilitate automated debugging in any environment that employs function calls for the setting or modification of a parameter within an object. The present invention is not limited by the exemplary computer programming languages illustrated herein, data formats, or exemplary application packages featured herein.

As electronic design automation (EDA) and circuit design is becoming more and more intricate and complex, the demand for interoperability of designers, design houses, and support products is increasing. Re-useability of code and quick, efficient, and potent debugging and designing tools are becoming increasingly essential. In performing the layout or silicon realization by a designer, such a task is rarely manually performed, but is instead automated through the use of parameterized cells (PCELLS or PYCELLS, used interchangeably herein) provided by a fabrication house or foundry, such as, for example: Taiwan Semiconductor Manufacturing Company (TSMC), among others, which will often provide a PDK or library of components to be used to form any cell in a given design. A PDK developer for a fabrication house will create this PDK for an end user, such as a circuit layout designer, who will use the PDK to automatically generate, for example, a layout based on a circuit schematic, adding in parameters, as needed, for the design relying on the PDK. Therefore, for a circuit designer to successfully generate a layout with the PDK, a PDK developer will need to debug mistakes or errors in the PDK which would propagate in to the layout generation. Conventionally, a developer of the PDK would need to generate and inspect a test layout, find the errors or mistakes, and determine which cell the mistakes or errors belong to. Then, the developer would need to attempt to locate (within a vast library of different cells and source code files of potentially different languages) where the particular callback function which instantiates instances of that cell and/or modifies parameters of that cell is located. The developer would then need to open the correct source file, scroll to the callback function, decipher the coding, manually insert a break point, and establish a debugging interface which will execute the callback function in a debugging mode. While this may seem a trivial matter, many factors, layers, and abstractions complicate the matter. Indeed, the original source code for the cell objects may be transformed from its original language (virtually any computer programming language capable of providing function calls and an object oriented structure) into an intermediate language and then stored in a database format in this transformed manner at run-time. Therefore, it is no small task to locate a parameter's callback function that can be buried in any of potentially thousands of heterogeneous source code files potentially comprising different computer programming languages. It is to be understood that the description of the exemplary embodiments below are not intended to limit the scope of the present invention to EDA embodiments, or to any particular environment, language, or format.

In the event of an error during the test layout generation, a developer, conventionally, has been forced to abandon the layout, search through massive amounts of code to locate where the problem is, and attempt to debug the situation manually through the insertion of break points, callouts, traces, and other such debugging tools and measures, as known to one of skill in the art. Such distractions can prove costly and time consuming in the overall EDA design flow, especially considering the iterative nature of such a design flow.

There is therefore a need for a system and method for automatically discovering and displaying parameters of cells in a layout. There is a need for a system and method which provide an interface for a developer to select a problematic parameter and have the source code files related thereto automatically located. There is a need for a system and method to locate a specific callback function in the source code pertaining to the setting of the selected parameter, load the source file, and present the relevant portion to the user. There is a need for a system and method to automatically set a break point at a relevant portion of the located callback function and provide the user an integrated debugging environment to enable the developer to evaluate and remedy problems with the source code, such that the PDK for generating a layout or circuit realization may be efficiently debugged while not adding substantial distractive and interruptive tasks for an otherwise efficiently engaged developer.

SUMMARY OF THE INVENTION

It is an object of the present invention to provide a system and method for automatically establishing a debugging environment for a developer.

It is another object of the present invention to provide a system and method for automatically locating source code files and callback functions related to a selected parameter.

It is yet another object of the present invention to provide an automated intelligent break point management system.

These and other objects are attained in a system and method for automatically guiding debugging of a computer program operable to execute a set of callback functions. The system comprises a data store, a user interface, a callback-function locator module, a callback-function arresting module, and a debugging user interface. The data store contains a plurality of source code portions corresponding respectively to the callback-functions in the set. Each callback-function initializes at least one parameter component. The at least one parameter components collectively define at least a portion of a cell. The data store selectively maintains the source code portions of the set according to at least one of the callback-function and parameter component defined thereby. The user interface is functionally coupled to the data store and is operable to acquire a selection of a parameter component from a user for a cell defined in the data store. The callback-function locator module is functionally coupled to the data store and the user interface and is operable to map the selected cell parameter component to a corresponding one of the set of callback-functions in the data store responsive to a user's selection of the parametric component in the user interface. The callback function locator module is further operable to select the source code portion in the data store based at least in part upon the mapping of the selected cell parameter component to callback-function. The callback-function arresting module is operable to arrest execution of the callback-function mapped by the callback-function locator module at a breakpoint set for the selected source code portion, where the breakpoint arrests execution of the callback function to thereby preserve at least a portion of a system state. The debugging user interface is functionally coupled to the data store and is operable to display at least a portion of the preserved system state related to the callback-function.

A method realized in accordance with the present invention comprises establishing a data store containing a plurality of source code portions corresponding respectively to the callback functions in the set. Each of the callback functions initialize at least one parameter component. The at least one parameter components collectively define at least a portion of a cell. The data store selectively maintains the source code portions of the set according to at least one of the callback function and parameter component defined thereby. A user interface is actuated to acquire a selection of a cell parameter component. A computer processor is actuated to map the selected cell parameter component to a corresponding one of the callback-functions. The computer processor is further actuated to select the source code portion in the data store based upon the mapping of the selected cell parameter component to callback-function. The computer processor is further actuated to modify the selected source code portion by inserting at least one breakpoint in the callback function thereof to define a modified callback function, wherein the breakpoint arrests execution of the callback function. The processor is then actuated to execute the computer program to thereby arrest execution of the computer program at the breakpoint of the modified callback function for debugging by the user thereat.

Another method realized in accordance with the present invention comprises providing a storage memory storing a source code for a plurality of objects, each object having at least one parameter component and each parameter component being modifiable through the execution of an object function configured to have write access to the parameter component. A user interface which is operably coupled to the storage memory is established and is operable to display parameter components of each object. The user interface is actuated to acquire a user selection of the object parameter component of interest. A computer processor is then actuated, responsive to the user's selection of the object parameter component of interest, to locate, in the storage memory, a source code for an object function corresponding to the selected object parameter component of interest. The located source code of the object function is then automatically reconfigured to include a breakpoint therein. The breakpoint will arrest normal execution of the object function thereat. The reconfigured object function is then executed and a system state related to the object is captured. A debugging interface is then displayed to the user including at least a portion of the system state related to the object.

Another method realized in accordance with the present invention comprises providing a memory which selectively maintains a source code defining at least one cell object of an Electronic Design Automation (EDA) design. Each cell object has at least one parameter component and at least one parameter setting function. Each parameter component is modifiable through execution of the parameter setting function which is configured to have write-access to the parameter component. A user interface which is operably coupled to the memory is provided. The user interface is operable to display parameter components of each cell object and receive a user selection of at least one of the parameter components. The user interface is actuated to accept a user selection of at least one of the parameter components. A computer processor is actuated to locate in the memory, responsive to the user selection, a source code for a parameter setting function corresponding to the selected parameter component. A breakpoint is established referencing the located parameter setting function of the selected parameter component. The parameter setting function is then executed to thereby arrest execution of the computer program at the breakpoint of the parameter setting function for debugging by the user thereat.

Additional aspects and utilities of the present general inventive concept will be set forth in part in the description which follows, and, in part, will be apparent from the description, or may be learned by practice of the general inventive concept.

DETAILED DESCRIPTION OF THE PREFERRED EMBODIMENTS

Figure 1A:
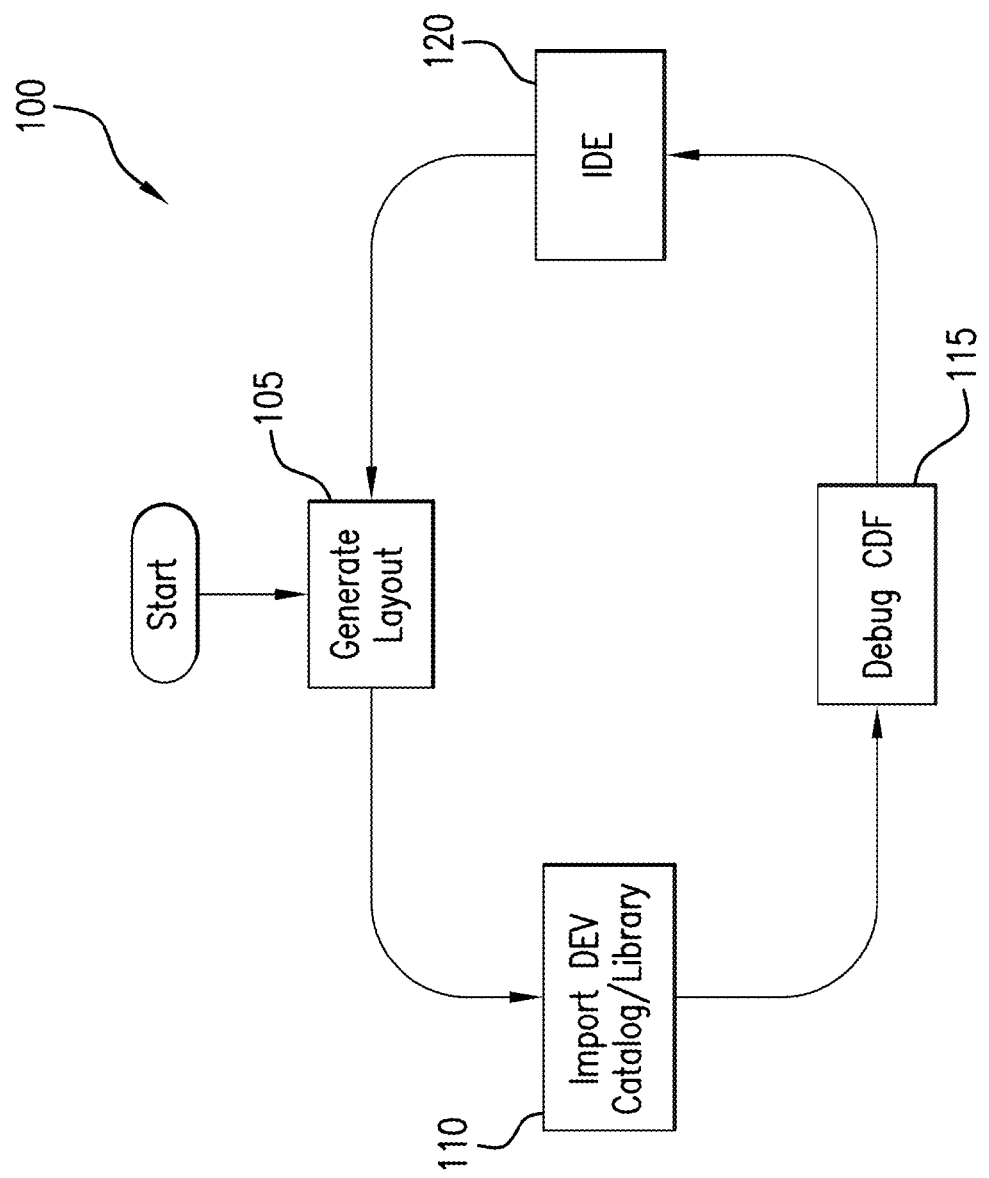
FIG. 1A is a simplified flow diagram illustrating an exemplary debugging and test-layout/silicon realization flow of an EDA process.

Reference will now be made in detail to the embodiments of the present general inventive concept, examples of which are illustrated in the accompanying drawings, wherein like reference numerals refer to the like elements throughout. It is to be understood that the term invention, when used herein, refers to the general inventive concept underlying the exemplary embodiments described below, and that the inventive concept is not limited to such illustrative embodiments themselves.

Systems, components, integrated circuits (ICs), and the like, may be modeled in a variety of different ways in an electronic design automation flow. For example, some of the ways of modeling a system include a merely logical schematic diagram which omits all physical characteristics or dimensionality and merely shows simplified or abstracted representations of components or cells within the device. Another manner of representing a system is a physical layout which shows an almost fully elaborated schematic with actual physical components representing their actual physical dimensionality and which are laid out in a topographical manner as they are intended to be actually physically realized on a silicon circuit-bearing-medium by a fabrication house. While the logical schematic is very conceptual and abstracted, the generation of a more specific and fully laid-out physical layout from the abstracted schematic is necessary for circuit design to conclude with a physical working product.

Rather than recreating a new schematic every time a new layout is needed, it is desirable to enable reuse of the abstracted schematic to dynamically generate layouts for the given situation. To do so, a user interface is provided to accept values from a user for a plurality of different parameters for the individual cells or components (as defined by a given process design kit or PDK) that will be used to generate the layout from the schematic. However, in attempting to dynamically generate a silicon realization or layout from an abstracted schematic in concert with the process design kit (PDK) and the user-supplied parameters, problems or bugs will almost certainly be encountered. A system and method realized in accordance with the present invention seeks to dramatically reduce those problems and provide a framework for developers to evaluate, debug, and repair the problems with the generation of the layout without distracting designers from the design flow.

Traditionally, the first indication of something amiss may be an error in a test layout. Such error would require a developer to perform a complicated process of evaluating which individual portions of the test-layout had problems. Once it was determined which portions of the layout had problems, the developer would need to determine which source code files contained the functions which generate those components containing the individual problems. The developer would need to locate the correct callback or parameter-setting-function and manually insert break points. The developer would also need to establish a debugging integrated development environment (IDE), enable and arrange the various debugging tools and source-code view window, and manually progress through the execution of the callback function. The developer would also need to monitor variable and system state to attempt to manually discern the location of the problem in the source code so as to be able to debug and remedy it.

As seen in the simplified flow diagram of FIG. 1A, a debugging process 100 in conformance with an exemplary embodiment of the present invention is shown. The debugging process starts off at block 105 generating a layout and progresses to block 110 where the developer's library or catalog is imported. Such library may be a process design kit (PDK), perhaps provided by a fabrication house, such as Taiwan Semiconductor Manufacturing Company (TSMC). Such PDK may, among other things, contain a vendor-specific implementation of general-purpose components or cells, source code, preferably in component description format (CDF or interoperable component description format (iCDF), used interchangeably herein), to generate such components or cells, and code to generate a user interface to solicit parameters for those cells. Once the PDK library or catalog has been imported, the flow progresses to block 115, and a debugging of the component description format (CDF) source code for generating the components or cells is performed. The debugging, in an exemplary embodiment, proceeds to the SKILL, Python, Tool Command Language (Tcl), SCHEME, Lisp, or the like integrated development environment (IDE) at block 120 where a source code of a relevant callback or parameter-setting-function for a given component or cell is performed. Such source code may be implemented in any computer language known to one of skill in the art and is not limited to the illustrative SKILL, Python, Tcl, SCHEME, or Lisp examples. Upon completion of the debugging, the generation of the test-layout at block 105 is again attempted.

Figure 1B:
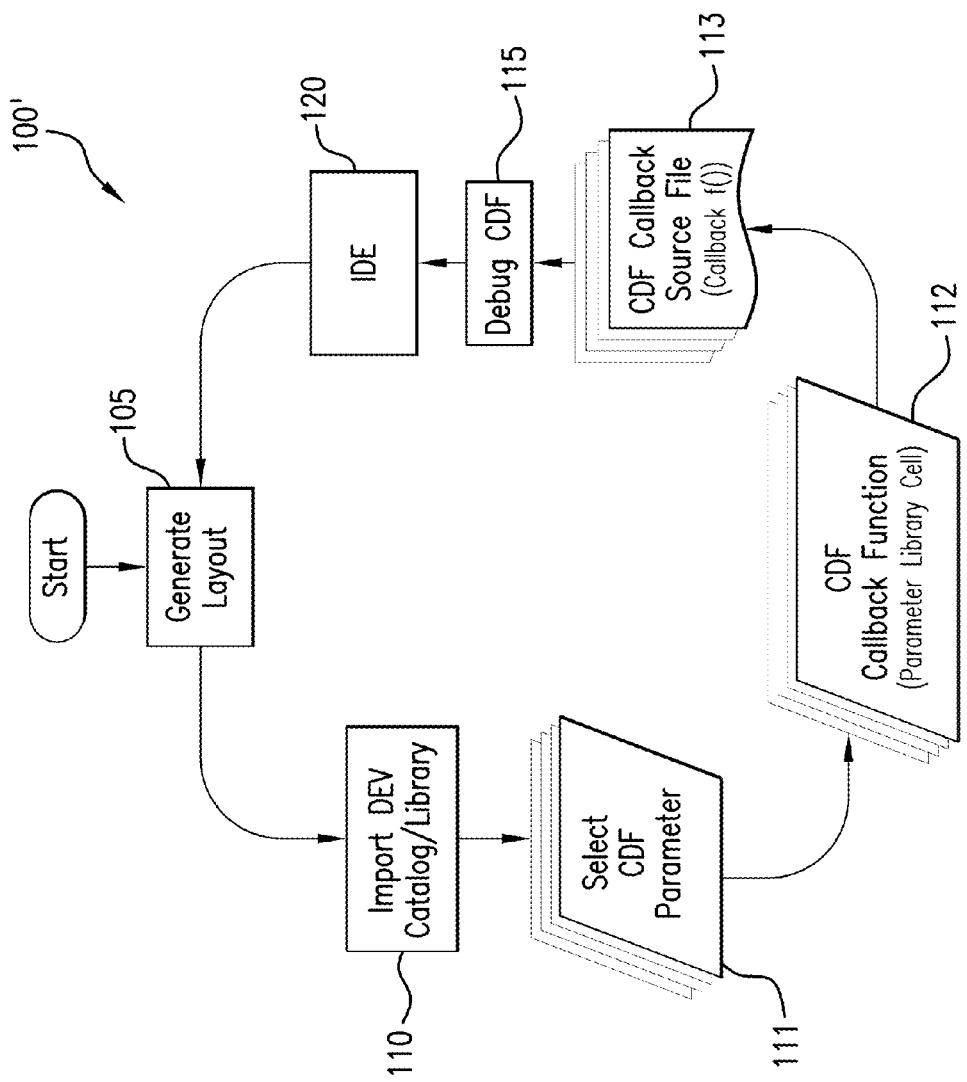
FIG. 1B is another simplified flow diagram illustrating an elaborated debugging flow of the test-layout or silicon realization.

As seen in FIG. 1B, the debugging process 100' is initiated at block 105 where a test-layout is attempted to be generated. Should the generation of the layout fail at block 105, importation of the PDK containing the CDF source code for the device may be performed at block 110. The system designer, at block 111, may select a desired parameter of the CDF to allow the user to debug such parameter. At block 112, the user is guided to the CDF callback function for the selected parameter of the library and cell contained in the PDK device imported at block 110. The process automatically finds the source code files contained in the PDK device library which correspond to that library and cell and also contains the callback function which is related to the selected parameter. The source code files and callback functions may be located by searching for parameter names, indexing a lookup table, following a predefined placement standard, or the like. Such location and eventual display is performed automatically and preferably responsive to the mere selection of a debuggable parameter. At block 113, the actual source code file containing the callback function related to the selected parameter is located and displayed in a debugging IDE for the user's convenience. This debugging IDE may be fully generated and presented to the user at block 115. Such debugging IDE of block 115 is preferably tightly integrated with the SKILL IDE which is used for generating parameterized cell layouts. Upon completion of the user's interaction with the source code and debugging IDE, again a layout is attempted to be generated at block 105.

Figure 1C:
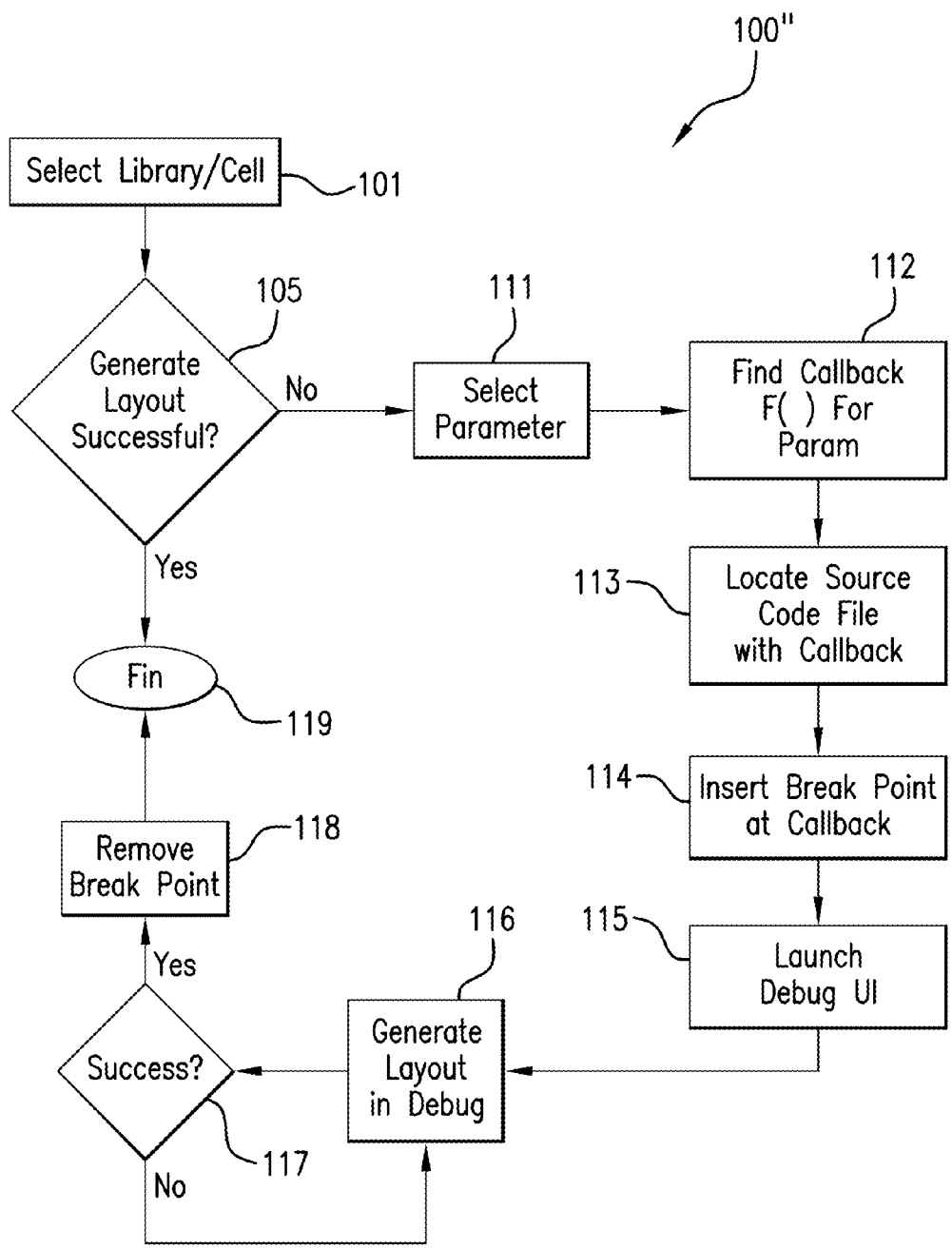
FIG. 1C is an even more elaborated exemplary flow diagram illustrating an automated debugging flow in accordance with an exemplary embodiment of the instant invention.

As seen in FIG. 1C, another exemplary embodiment of the debugging flow 100'' is shown. In this exemplary embodiment, a user first selects a library and cell at block 101. At block 105, a test-layout is attempted to be generated and a decision is reached on whether the generation of the layout was successful. If it was not successful, then the flow proceeds to block 111 where a developer selects a parameter that they have reason to believe may be causing the failure to successfully generate the layout. At block 112, a callback function for the selected parameter which was selected at block 111 is located. The callback function may be located by searching the CDF source code of the PDK for a callback function setting the selected parameter or by other measures known to one of skill in the art. Once it has been determined which callback function sets the parameter that was selected, the source code file containing the callback function is located at block 113. At block 114, an automatically generated break point is inserted into the callback function, preferably at the initialization of the callback function. However, such break point may be set anywhere (in the function, preceding, or succeeding it) as would be known to one of skill in the art. The break point may be set at the initialization of the callback function, upon completion of the setting of variables or parameters, at the conclusion of the callback function, and the like. In a preferred embodiment, the break point will be set at the entry point of the parameter's callback function. Alternatively, the location of a break point may be stored in a location external to the source code itself, such as in a lookup table, a break point database, in a memory location of the debugging application or a host application, such as a layout generation tool or the like, or any other such measures for signaling where to halt or break execution of the source code as would be known to one of skill in the art may be employed.

Additionally, the user or developer may debug other CDF functions, such as 'Form Init' and 'Form Done' functions which, while established as part of the underlying CDF system, are user-developed code and are susceptible to errors or bugs. When the CDF information for a selected lib/cell is to be modified or used, the CDF system provides the developer with two points of customization opportunities: 'Form Init' is a function which allows the developer to setup whatever they deem necessary, and 'Form Done' is a function which allows the developer to post-process the modified CDF parameters as they deem necessary. Such other, non-parameter-callback functions may be debugged in a similar manner as described above, however, the developer may simply select the 'Form Init' or 'Form Done' function name to start automatically debugging.

Once the break point has been set, the debugging user interface is launched at block 115. The debugging user interface allows the user to see the source code used to generate the actual geometric shapes and the layout from the source code of the callback functions and the parameter setting functions. Upon completion of the debugging user interface, the flow proceeds to block 116 where the layout is again attempted to be generated at this layout generation step of block 116. However, the break points are activated such that generation of the layout is stopped or arrested mid-execution such that the system state, parameter values, and variable values, remain. The user is able to iteratively step between block 116 and block 117 where the user is able to determine whether the callback function and the layout generation were successful. Upon a successful completion of the debugging process at block 117, the flow proceeds to block 118 where the automatically-inserted break point is then removed. Care is taken to avoid removing any other break points set manually or by other means. In this manner, only the break point which was previously set automatically by the debugging UI is removed. Once the break point has been removed, the flow proceeds to block 119 where the test-layout is successfully generated and the debugging is completed.

Figure 1D:
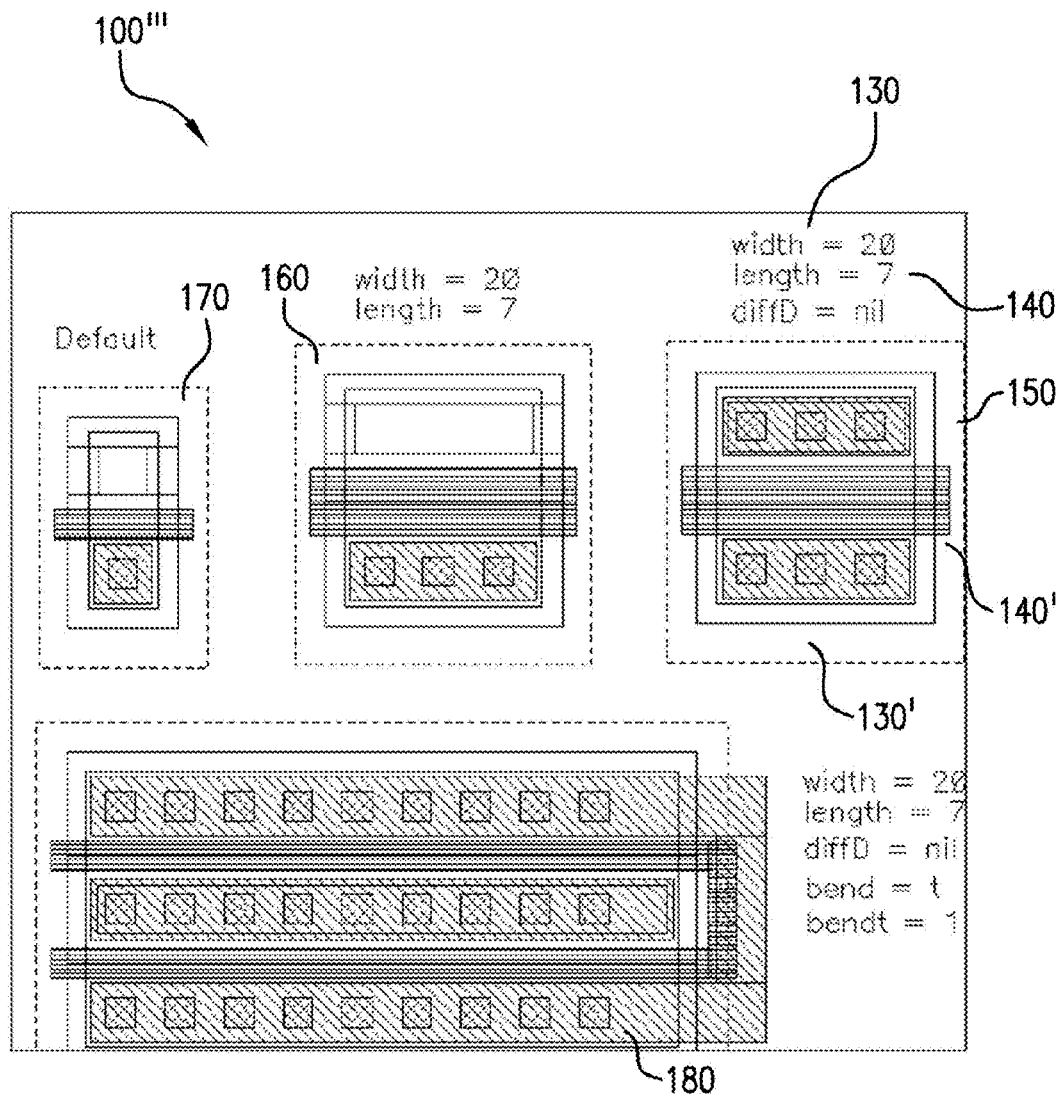
FIG. 1D is an illustrative example of a generated physical test-layout or silicon realization of an integrated circuit (IC) device generated in accordance with an exemplary embodiment of the present invention.

FIG. 1D illustrates a simplified exemplary layout generated in accordance with an exemplary embodiment of the present invention. Such an exemplary layout 100''' has been successfully generated. Each individual cell, e.g., 150, 160, 170, and 180 of the exemplary layout 100''', as discussed above, is dynamically generated from the combination of an abstracted schematic file, a PDK, and a set of parameters for each individual cell set by a designer. Combining schematics with parameterized cells in the PDK leverages the logical, abstract nature of the cell captured in the schematic, while allowing the individual physical attributes or parameters necessary for the specific implementation of the cell to be determined further down the line and more proximate to the actual silicon realization. Thereby the bulk of the logical schematic is able to be reused while allowing for a layout that is still able to be narrowly tailored for any given situation. Such is illustratively shown at cell 150 having both a width parameter 130 and a length parameter 140. These parameters 130 and 140 are reflected in the actual geometric shape of the cell 150. Cell 150 reflects the parameters 130 and 140 by having actual geometric parameters or characteristics as shown at 140' and 130' to respectively correspond to the parameters 130 and 140 which are set in the instantiation of the layout.

The callback functions allow an EDA design software suite to solicit such parameters from a user and input them into the actual layout or silicon realization generation.

Figure 2:
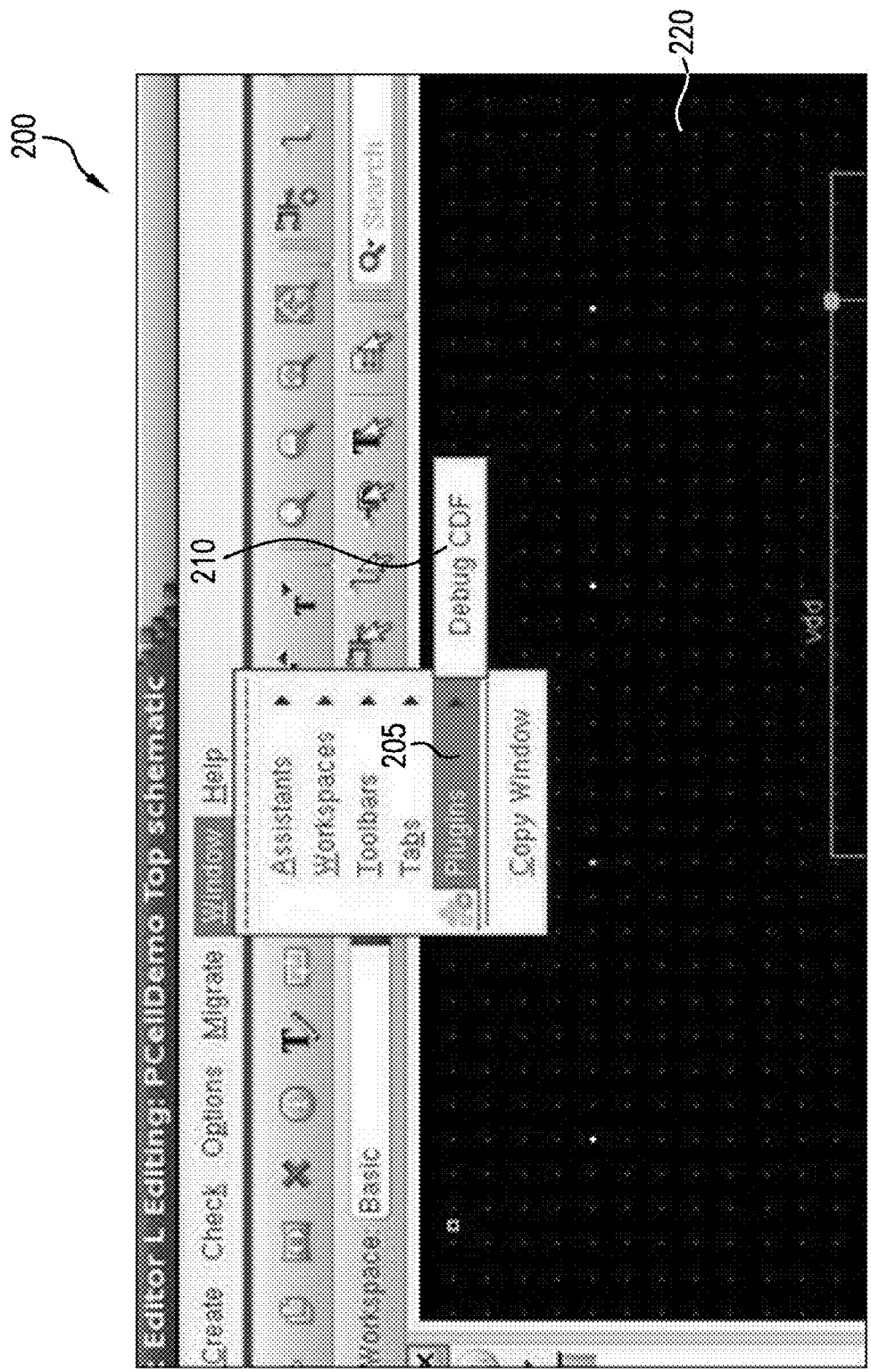
FIG. 2 is an exemplary screen shot of a user interface in accordance with an exemplary embodiment of the present invention.

As seen in FIG. 2, an exemplary portion of a user interface 200 for the instant application is shown. Such user interface may provide a plurality of different menus, toolbars, graphical user interface elements, as well as extensible plug-ins which further the functionality of such a user interface or tool. In this instance, it is envisioned in a preferred, though not exclusive, embodiment that a plug-in menu tool 205 be provided to allow a user to select the debug CDF plug-in 210 such that further user interface and integrated design environment (IDE) for the debugging environment may be provided to the user. It is seen that an exemplary graphical representation of a layout or schematic 220 may be provided along with portions of the user interface.

Figure 3:
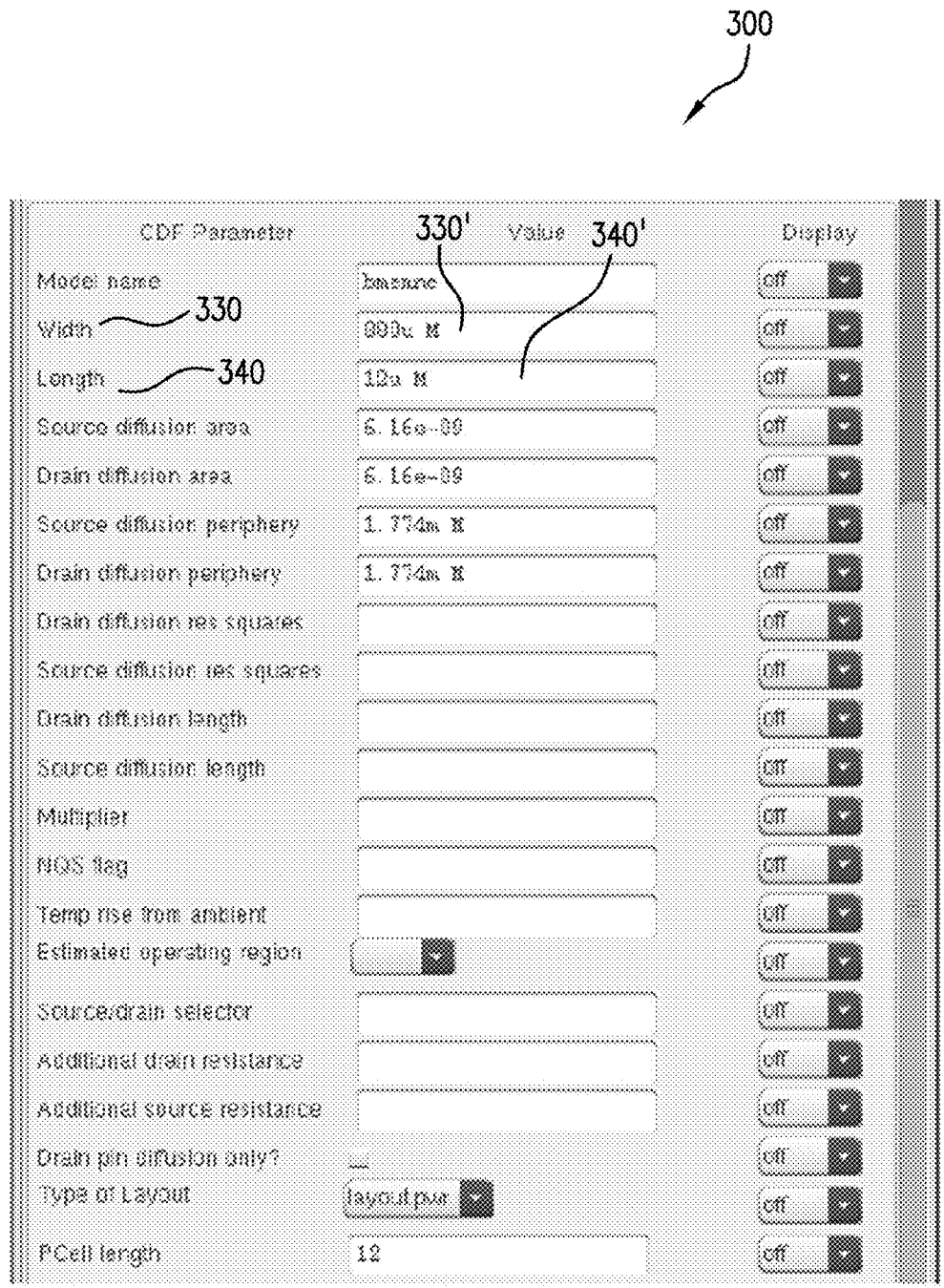
FIG. 3 is an exemplary user interface detailing a cell of the present invention showing a plurality of different parameters related to the cell.

FIG. 3 shows another portion of a user interface in accordance with an exemplary embodiment of the present invention. The instant portion of the user interface 300 relates to adding an instance of a cell. The cell has a plurality of different parameters such as width 330 and length 340 along with many other parameters which may bear upon the functional aspects and/or geometric aspects of the cell. The width 330 and length 340 parameters are shown being provided by user interface elements respectively 330' and 340'. Herein, a user is able to input a plurality of different parameters bearing upon a selected cell. The representation of the different forms which solicit input from the user and accept feedback therefrom are able to be customized and are narrowly tailored for each individual cell. Upon a user entering a value into one of the fields for setting a parameter, a callback function relating to the setting of that parameter is then called to provide access to and set the parameter of the cell to be the user input value. Range, constraint, value checking, and the like may be provided to ensure the input value is consistent with expectations, design rules, and/or constraints.

Figure 4A:
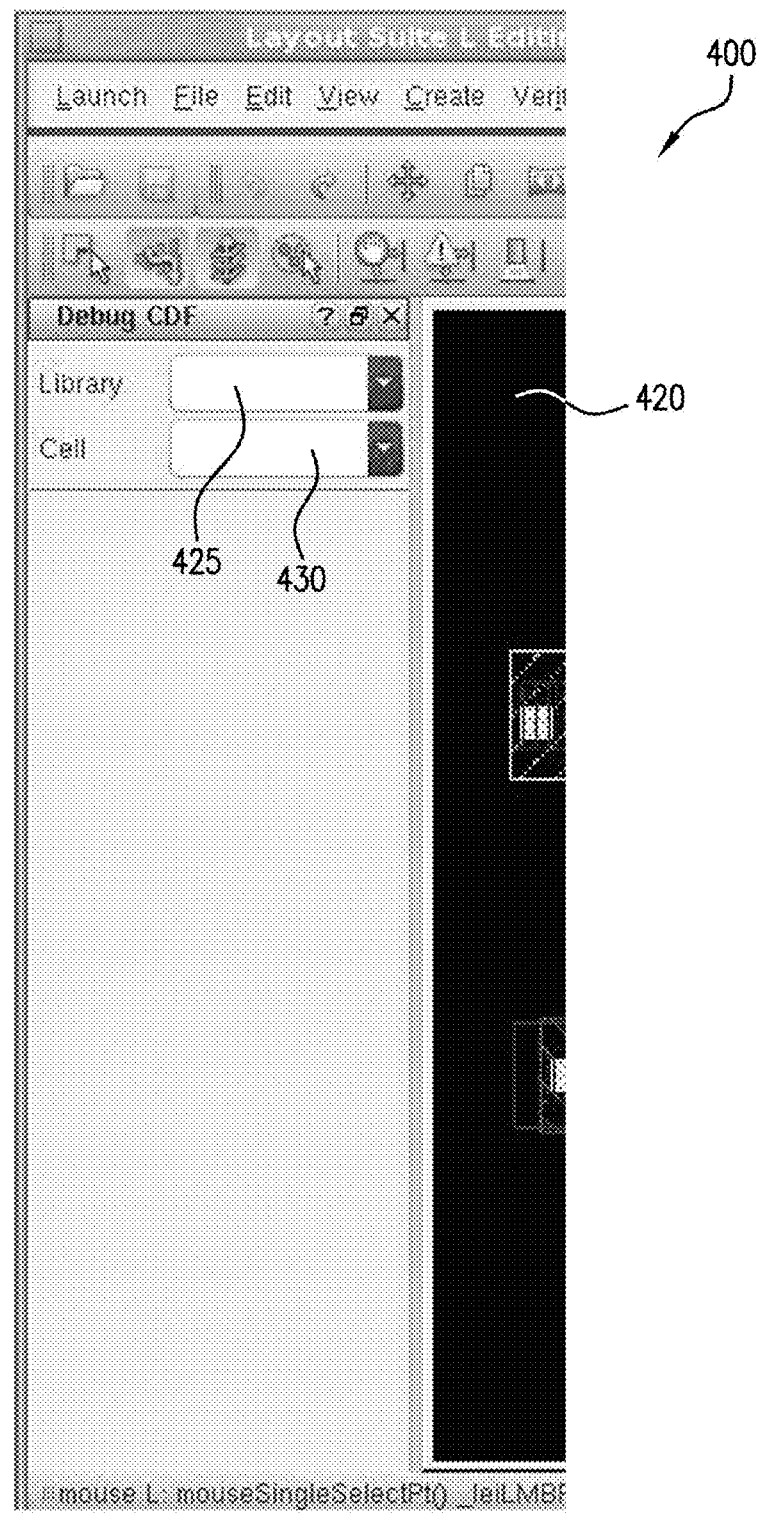
FIG. 4A is yet another exemplary user interface generated in accordance with an exemplary embodiment of the present invention showing a debugging library and cell selector with an as-yet unpopulated parameter list of parameters relating to the cell.

FIG. 4A shows another portion of a user interface employed in an exemplary embodiment of the present invention. The portion of the user interface 400 shows a plurality of different user operable elements such as a library choice block 425 which allows a user to choose which library of different cells is going to be debugged. The user is also able to choose, among the library, which cell 430 they currently wish to debug or manipulate. Once a user has chosen both a library 425 and the cell 430, such cell may be displayed either in terms of its logical abstract schematic form in user interface display 420 or in terms of an actual physical geometric silicon-realization physical layout.

Figure 4B:
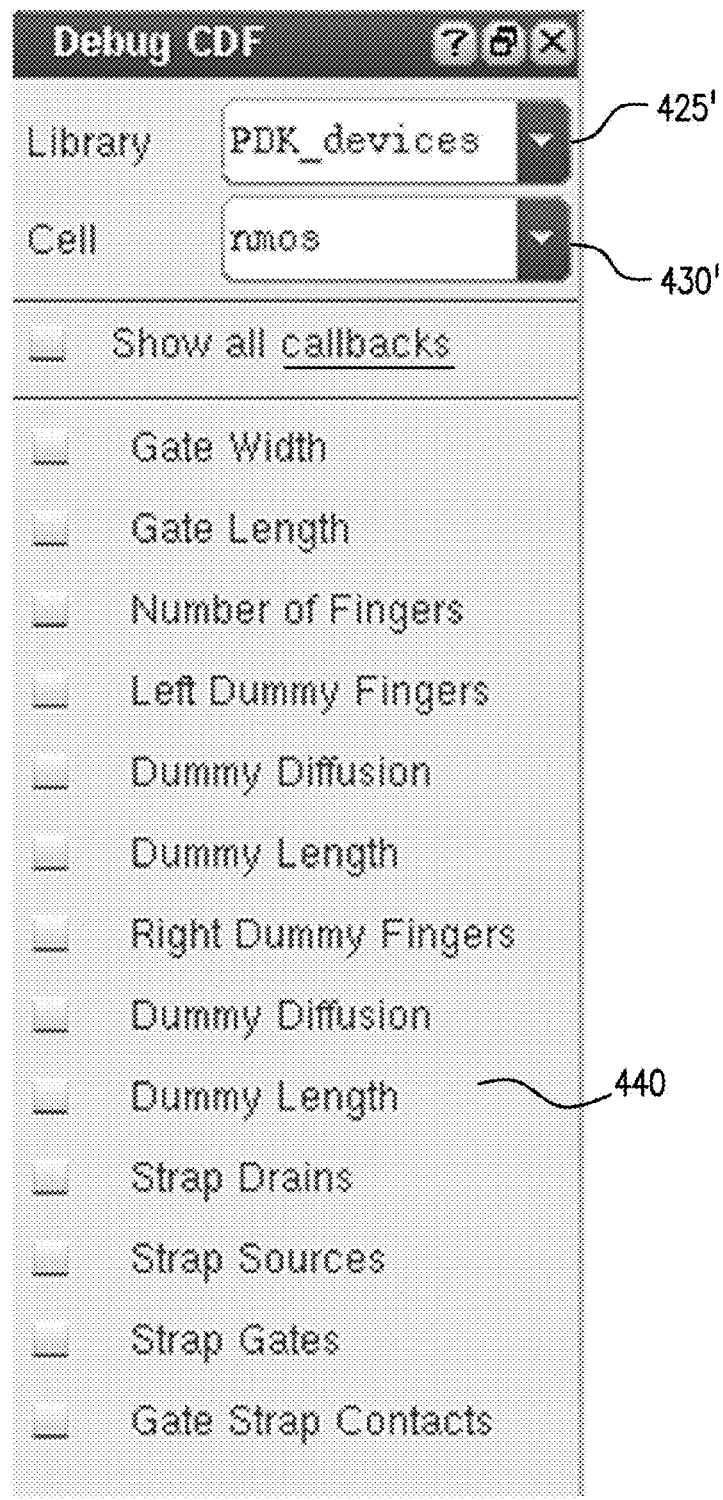
FIG. 4B is another exemplary embodiment of a portion of a user interface generated in accordance with an exemplary embodiment of the present invention showing a library with a selected cell and an enumeration of a plurality of different parameters relating to the cell contained in the library.

FIG. 4B shows another portion of the user interface displaying a list of all callback functions in block 440 which may include callback functions for the setting of different parameters such as width, length, number of fingers, source diffusion area, drain diffusion area, diffusion periphery, diffusion length, multiplier, resistance, and the like. Again, it is seen that in box 425', a user selects a library, and at block 430', a user selects a specific cell. Responsive to the selection of the library 425' and cell 430', the user interface responsively generates a listing of callback functions or parameters related to the cell previously chosen.

Figure 4C:
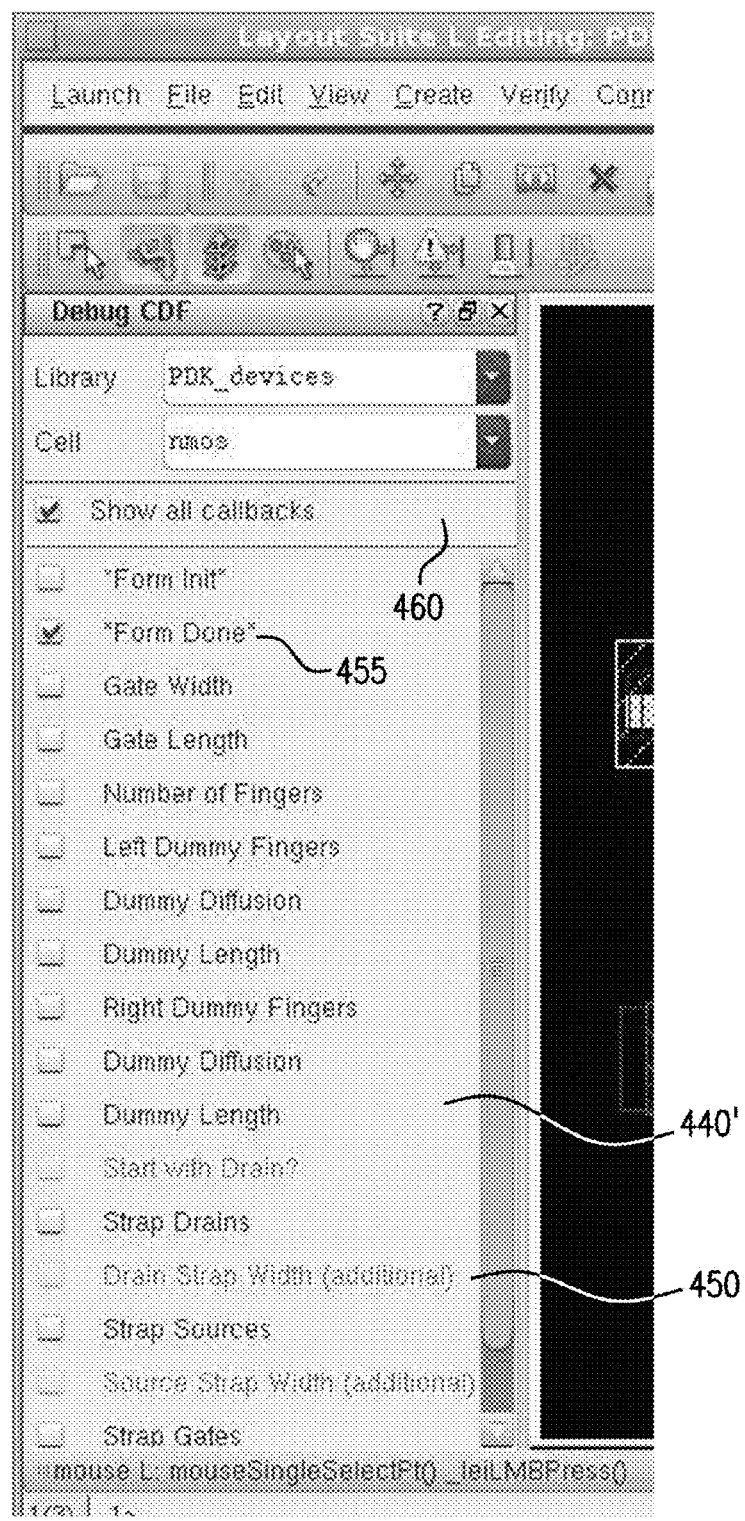
FIG. 4C is yet another illustrative example of a portion of a user interface in accordance with an exemplary embodiment of the present invention wherein a parameter or callback function has been selected relating to the cell of the library.

As seen in FIG. 4C, a user is optionally provided with a "show all callbacks" user interface element. Upon selecting show all callbacks, the user may be provided with an exhaustive or comprehensive list of different callback functions for the selected cell in the selected library. Not all of these callbacks that have been shown may be able to be debugged. In some instances, such as the "start with drain?" callback 440' or the "drain strap width (additional)" 450, the callback functions, 440' and 450 respectively may merely be in-line, highly abbreviated, or merely just the setting of a parameter to a specific value, such as x=y, and thus may not be debuggable. Such non-debuggable callbacks may be shown as grayed out or otherwise not user-accessible as they may not be debugged.

Figure 5:
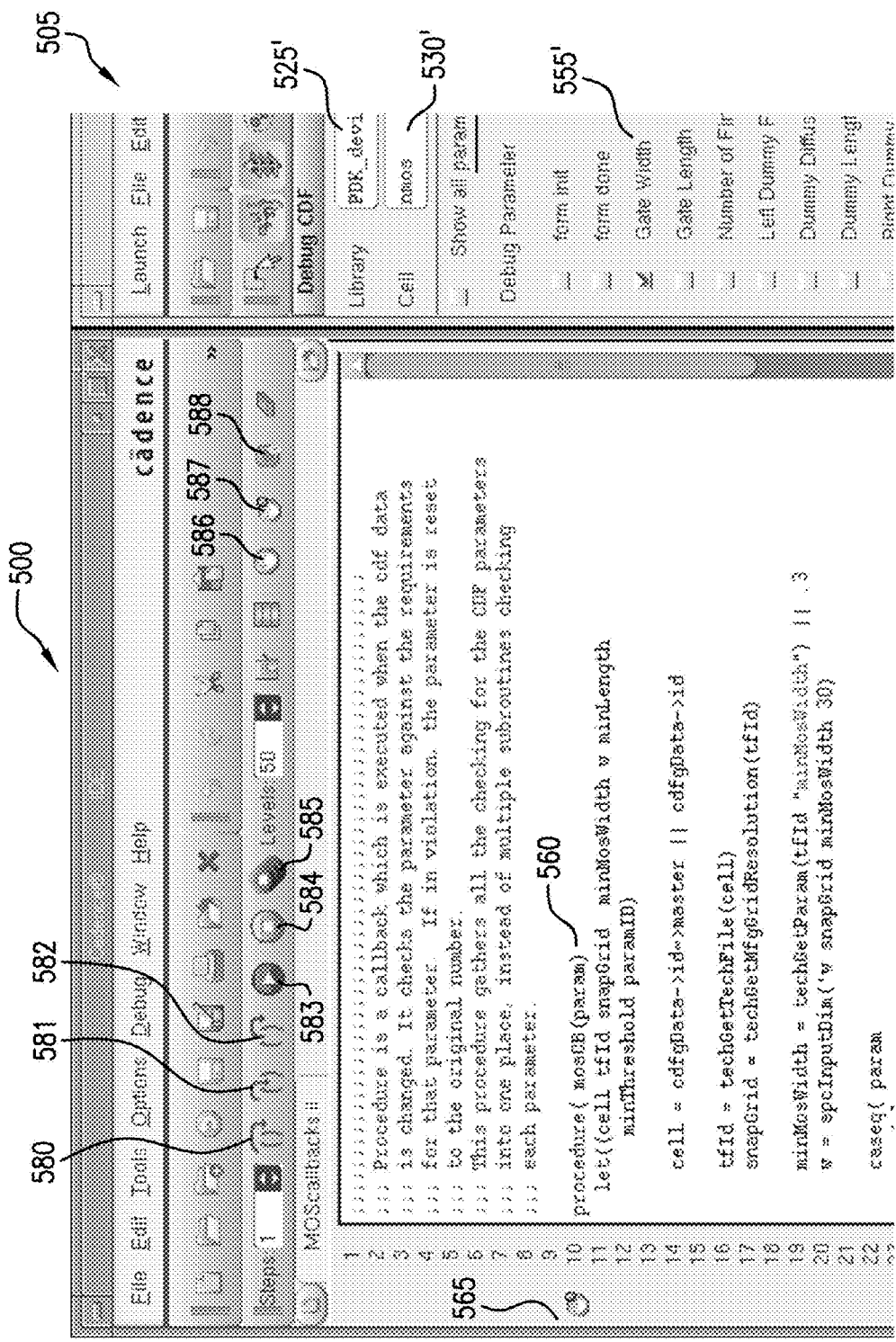
FIG. 5 is another illustrative example of portions of a user interface in accordance with an exemplary embodiment of the present invention showing a selection of a parameter of a cell contained in a library and a relevant source code file with the related callback function shown.

FIG. 5 shows several exemplary portions of a user interface in accordance with an exemplary embodiment of the present invention. User interface 505 may provide several different portions of differing functionality. For example, a library selection element 525' is provided. A cell selection user interface portion 530' is provided. Once a user has selected a library 525' and a cell 530', the debuggable parameters may be determined and displayed to the user including parameters such as gate width 555'. Additionally, once a parameter such as gate width 555' has been selected, a source code may be shown for a related callback function in another debugging interface such as 500. The debugging interface exposing the source code 500 preferably includes the individual callback function such as callback procedure 560. After both the source code file and a particular callback function relating to the selected parameter 555' have been located and shown, an automatic break point 565 is inserted therein.

Upon executing the callback function contained in the source code file, execution will be halted or arrested at the automatically set break point 565. In the integrated debugging environment, the user may be able to operate a plurality of different user interface elements such as the progress functions 580, 581, 582, 583, 584, 585, 586, 587, and 588. These user interface elements 580-588, for example, may provide such functionality as continue, stop, step, pause, stop at break point, stop completely, and the like.

Figure 6:
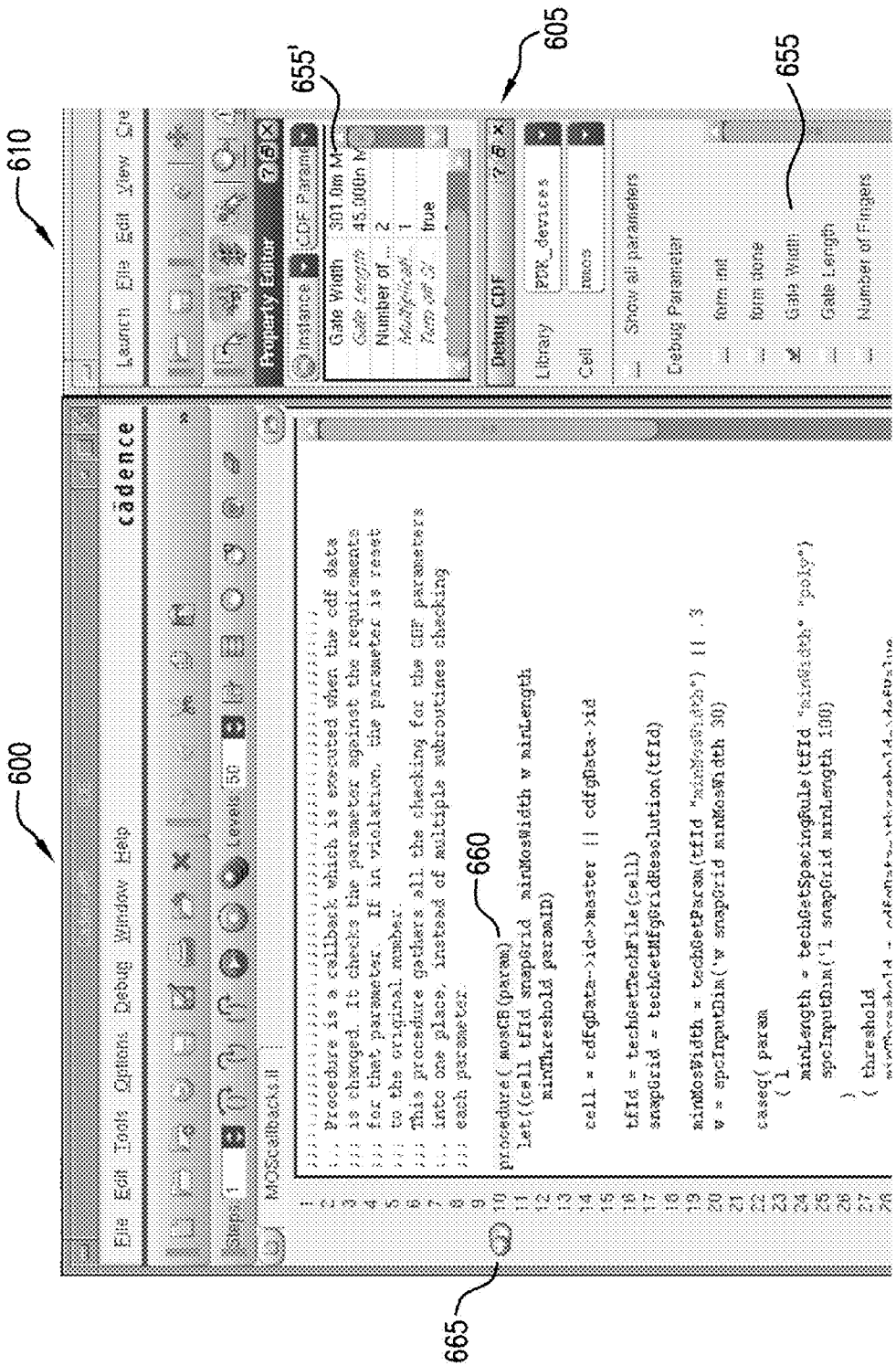
FIG. 6 is another example of portions of a user interface in accordance with an exemplary embodiment of the present invention.

FIG. 6 is another exemplary user interface in accordance with an exemplary embodiment of the present invention. The user interface provides a library/cell/parameter selection portion 605 wherein a parameter 655 may be selected in a given library and cell. Additionally, a code viewing portion 600 of the overall user interface may provide source code and a view of the procedures, callback functions, or other such mechanism or measure to instantiate, modify, or remove cells. An example callback function 660 is shown as "procedure (mosCB (PARAM)." As seen, an automatically set break point 665, having a graphical indicia is set at line 10 of the source code file to arrest execution at the "procedure" callback function 660. Additionally, a property editor portion 610 of the user interface is provided to allow additional functionality such as the setting of parameters such as gate width 655'. Through the use of the property editor 610, it may be that a user is able to set properties of a cell through the automatic execution of the callback function. Additionally, property editor 610 may provide a snapshot of the current system state providing additional help to a user in debugging the system. Such snapshot may show live or historic values of parameters, variables, or constants and thereby assist a user locate a problem and debug it.

Figure 7:
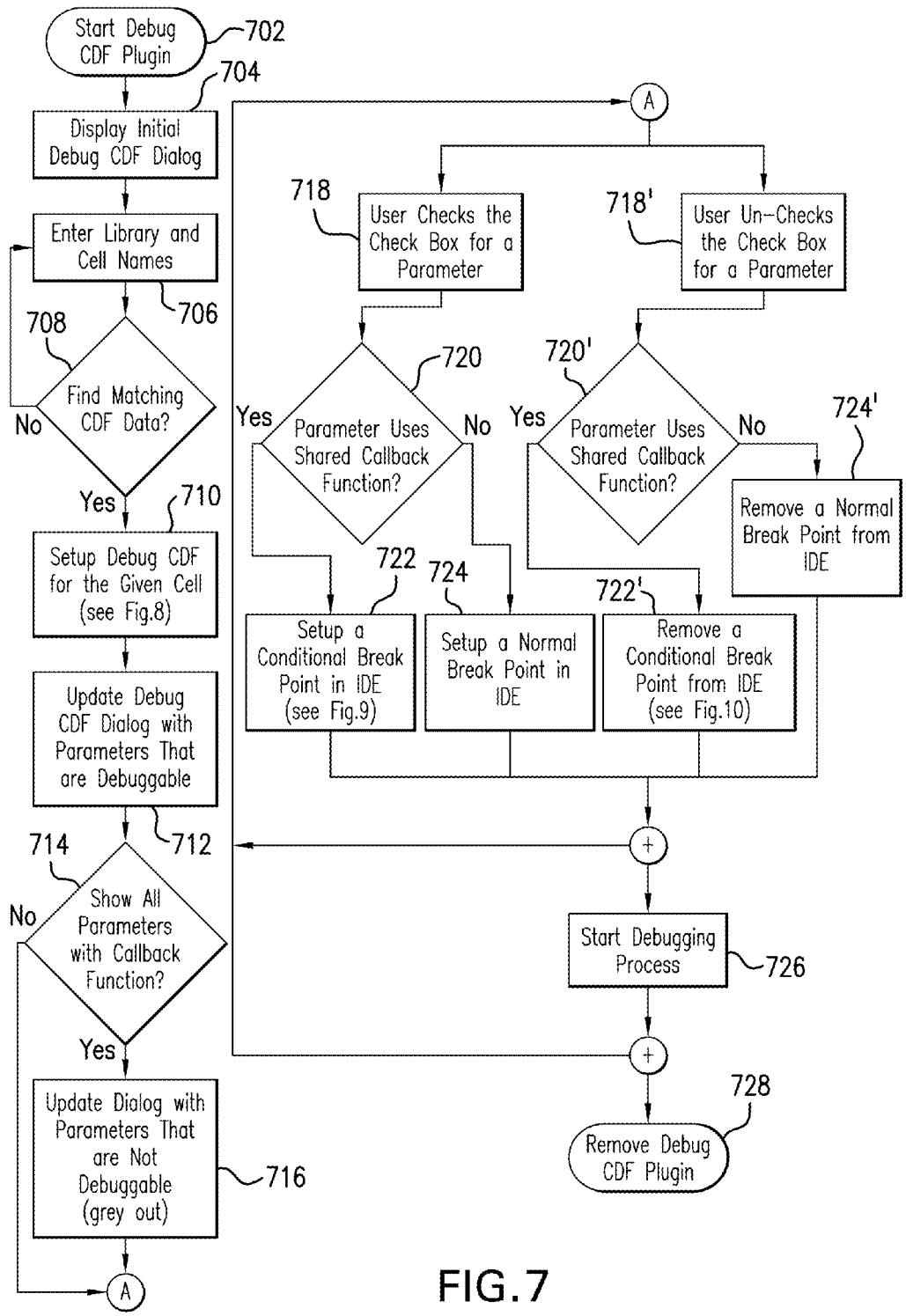
FIG. 7 is a simplified flow diagram illustrating, in more detail, an exemplary debugging and physical layout/silicon realization flow of an EDA process.
Figure 8:
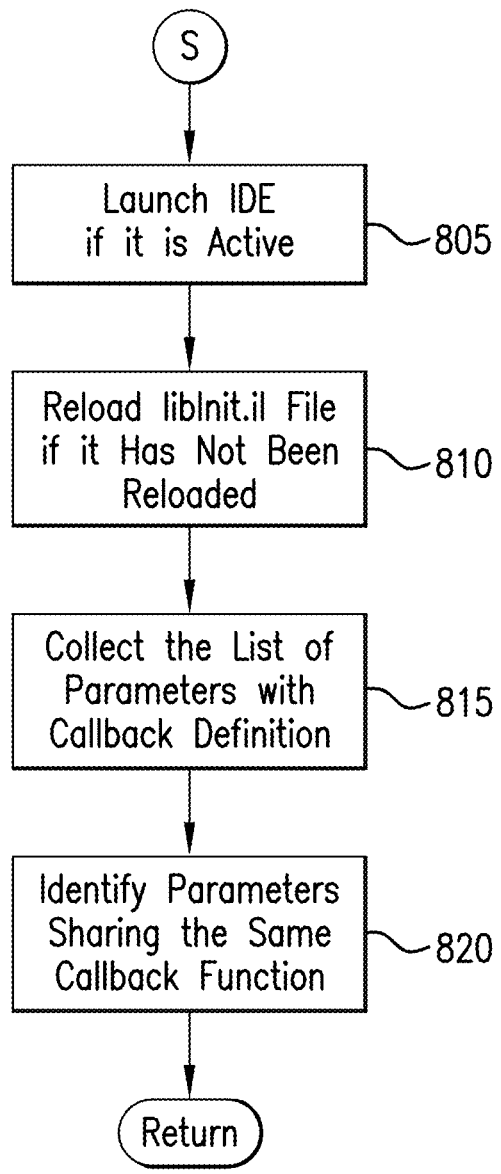
FIG. 8 is another simplified flow diagram illustrating portions of an automated debugging flow in accordance with an exemplary embodiment of the instant invention.

FIG. 7 shows a more fully elaborated flow diagram of a process in accordance with several embodiments of the present invention. At block 702, a developer starts a debug CDF plug-in such as by selecting (as seen in FIG. 2) the debug CDF 210 option. At block 704, the initial debug CDF dialog is displayed such as seen in FIG. 4A. Such initial debug CDF dialog may request a library and/or cell name. At block 706, the library and cell names are chosen and entered. Such entering of the library and cell names can be through any means known in the art, such as by direct text entry of exact names, by a drop down list which is pre-filled with a plurality of different libraries and cell names, by a 'browse' mechanism, a recently used menu, and the like. At step 708, it is determined whether the entered library and cell names can be found. If the source code containing the CDF or component description format for the cell contained in the library is indeed found, then flow may proceed to block 710. Else, flow returns back to block 706 for re-entry of both library and/or cell names. At block 710, if it is determined that a matching component description format (CDF) data source code has been found for the entered library and cell names, then the flow progresses to block 805 of FIG. 8 starting the flow S.

A SKILL integrated development environment (IDE) is launched at block 805. At block 810, the 'libinit.il' file will be reloaded if it is not already. The libinit.il is the preferred mechanism for PDK developers to load up all the necessary support data required to use a PDK in the actual design flow. For the end-users, circuit designers, (not PDK developers who are privy to the source code files) the libinit.il file will include the loading of SKILL functions in only their binary format (either as an encrypted file or a SKILL Context file). A layout generation tool, as used by a layout designer, may load the libinit.il file from a library when that library is accessed for the very first time. Preferably, any future reference to the library will not load the libinit.il again. As the debug CDF feature is designed for the PDK developers where they do have access to the original source code in the PDK for all the SKILL functions, the developers may have a slightly different libinit.il file which may load the original source code (not merely the binary version which is not debuggable).

When the developer needs to debug the source code, the source code should be loaded after the SKILL debugger has been installed and the libinit.il file has already been processed. Therefore the debug CDF sub-system should reload the libinit.il file to make the source files known to the debugger. This "reload" operation will preferably only be done once by the CDF debugger.

At block 815, the list of parameters with callback definitions are determined by scanning the source code of the library, or a lookup table, which may be stored in the libinit.il file. The list of parameters having a callback definition is then populated into a portion of the user interface, such as seen at FIG. 4B callback listing 440.

At block 820, it is determined which parameters share the same callback function. A callback function may set only one parameter or it may set a plurality of different parameters. In the case of setting multiple parameters, special care should be taken during the setting of the automatic break point to ensure that the break point is a non-promiscuous, selective conditional break point and only breaks the execution or arrests the execution of the code in the instance that the desired and selected parameter is being set and not for merely the setting of any other parameter.

After completion of block 820, the flow returns to FIG. 7, block 710. At block 712, the debug CDF dialog, as seen at element 440 of FIG. 4B, is updated to show parameters which are debuggable. Out of the universe of parameters, only a portion of those are debuggable, such as those that do not have merely inline parameter setting. If, for example, a parameter is set inline, such as parameter 'X=320' or parameter 'X=½Y', then it may be that the code is too simple to enable debugging. In such a case, it may be that the parameter or callback is not displayed in the debugging dialog box 440 of FIG. 4B. However, in an optional embodiment, a 'SHOW ALL CALLBACKS' command, as seen at block 460 of FIG. 4C, may be provided to enable the user to see all callbacks or parameters, even those which may not be debuggable.

As seen in FIG. 4C, 'START WITH DRAIN?' 440' is grayed out, as is 'DRAIN STRAP WIDTH (ADDITIONAL)' 450. Such grayed out callbacks or parameters 440' and 450 may exist, but may merely not be debuggable. In the event that the user does actuate the 'SHOW ALL CALLBACKS' command 455 of FIG. 4C, the flow will progress to block 716 where the dialog box is updated to include parameters that are not debuggable. In a preferred embodiment, such non-debuggable parameters may be grayed out.

A determination is then made whether a user has checked a specific parameter or callback in the debug user interface. If indeed a user checks the check box for a parameter, the flow will progress to block 718. At block 720, it will be determined whether the selected parameter uses a shared callback function. If indeed the parameter is set through a shared callback function, then the flow progresses to block 722. At block 722, a conditional break point, such as, in pseudo-code: 'break if callback==x' will be established.

Figure 9:
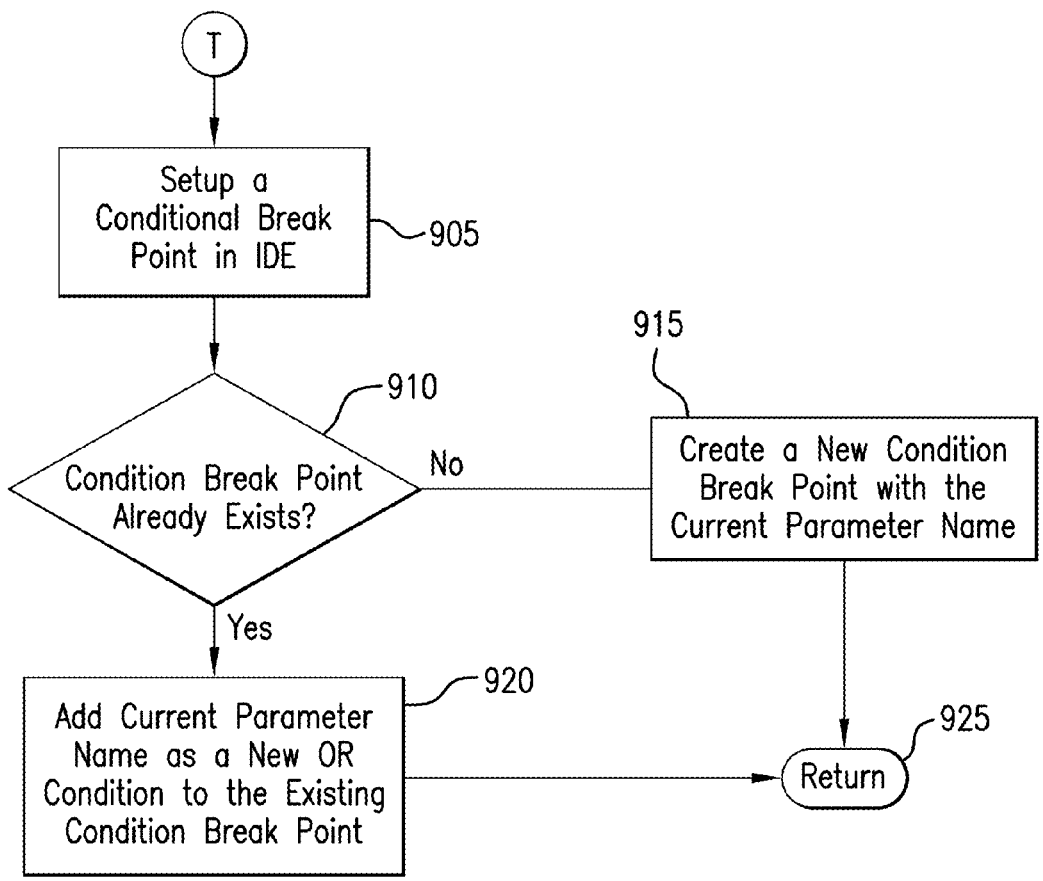
FIG. 9 is another illustrative example of a simplified flow diagram showing portions of a debugging flow in accordance with an exemplary embodiment of the present invention.

The flow for establishing a conditional break point is detailed in FIG. 9. At block 905, a conditional break point in the SKILL IDE is established. Such conditional break point, in a preferred embodiment, evaluates the parameter being set in the callback function. Upon an affirmative determination that the selected parameter is being set in this invocation of the callback function, only then will the execution of the callback function be arrested.

At block 910, it is determined whether a condition break point already exists. If not, then a new conditional break point is established at block 915, but if a conditional break point already exists, then the flow proceeds to block 920 where the current selected parameter is added into an OR statement with the existing conditional break point. For example, if a conditional break point had already been established for a gate length parameter, the conditional break point would simply be modified to break in the event of gate length OR the selected parameter, such as gate width. In other words, the conditional break point would be triggered at the setting of the gate length and also, at the setting of the gate width.

At block 925, the flow returns back to block 722 of FIG. 7. If, on the other hand, it is determined that the parameter does not use a shared callback function at block 720, then a normal break point is established at block 724. The normal break point does not evaluate the parameter being established, but promiscuously arrests the execution of the function by its mere invocation.

If the user, instead of checking the check box for a parameter, such as seen at block 718, instead unchecks a parameter such as at block 718', then a similar determination is made whether the parameter uses a shared callback function at block 720'. If a negative determination has been made at block 720', that the parameter does not use a shared callback function, then the normal break point is removed from the SKILL IDE at block 724'. If however the unselected parameter does indeed use a shared callback function, as determined at block 720', then the flow proceeds to block 722', where the conditional break point is modified to remove this parameter from its OR list from the SKILL IDE at block 722'. In other words, the conditional break point is modified such that it no longer breaks on encountering the selected parameter, but the break point will continue to function for other parameters that have been set in advance. Block 722' progresses to FIG. 10.

Figure 10:
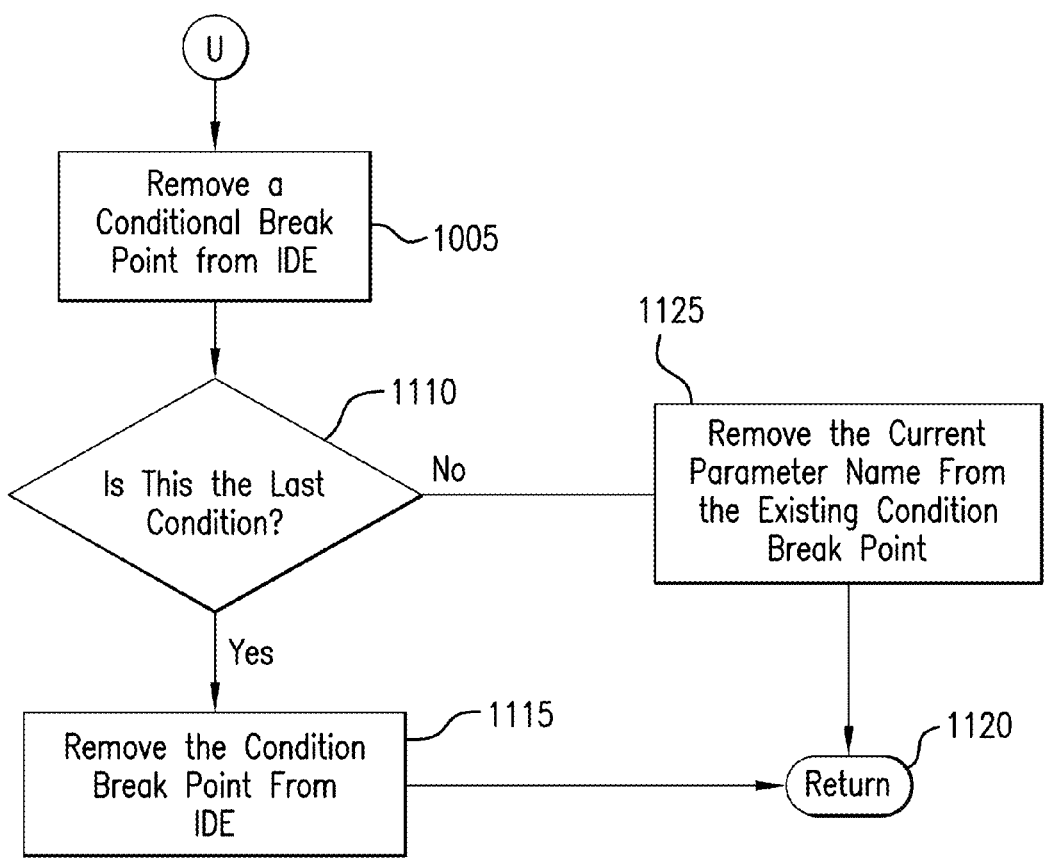
FIG. 10 is yet another simplified flow diagram illustrating a debugging flow in accordance with an exemplary embodiment of the present invention; and, FIG. 11 is a block diagram illustrating an exemplary interconnection of components in a processor-based system for implementing an exemplary embodiment of the present invention.

At block 1005 of FIG. 10, the conditional break point is to be removed from the SKILL IDE. Such is accomplished by a determination of whether any other conditional break points have been established and remain in effect for the callback function. Such determination is made at block 1110. If an affirmative determination is made, then the flow proceeds to block 1125 where the condition for the unselected parameter is merely removed, leaving the conditional break point intact for other conditions. For example, if a user unchecks the gate width parameter, leaving a conditional break point still remaining for gate length, the instant flow seeks to avoid disturbing or interfering with the other break points, but seeks to merely remove the condition of the unselected parameter. Conversely, if no other conditions exist and this is the last condition set for the conditional break point, then the break point in its entirety will be removed at block 1115. The flow then progresses to block 1120 which returns back to FIG. 7, block 722'.

The flow then proceeds to allow for user input and starting of the debugging process at block 726. User input is again allowed and a loop of the debugging process at block 726 is performed until a user indicates a desire to exit the debugging process or a successful test layout has been generated. Upon conclusion of debugging, the debug CDF plug-in may be removed at block 728.

In various embodiments of the invention, the system may be implemented in the form of software modules or hardware modules. In an embodiment of the invention, the system is implemented as part of an electronic design automation (EDA) or integrated development environment (IDE) system.

Figure 11:
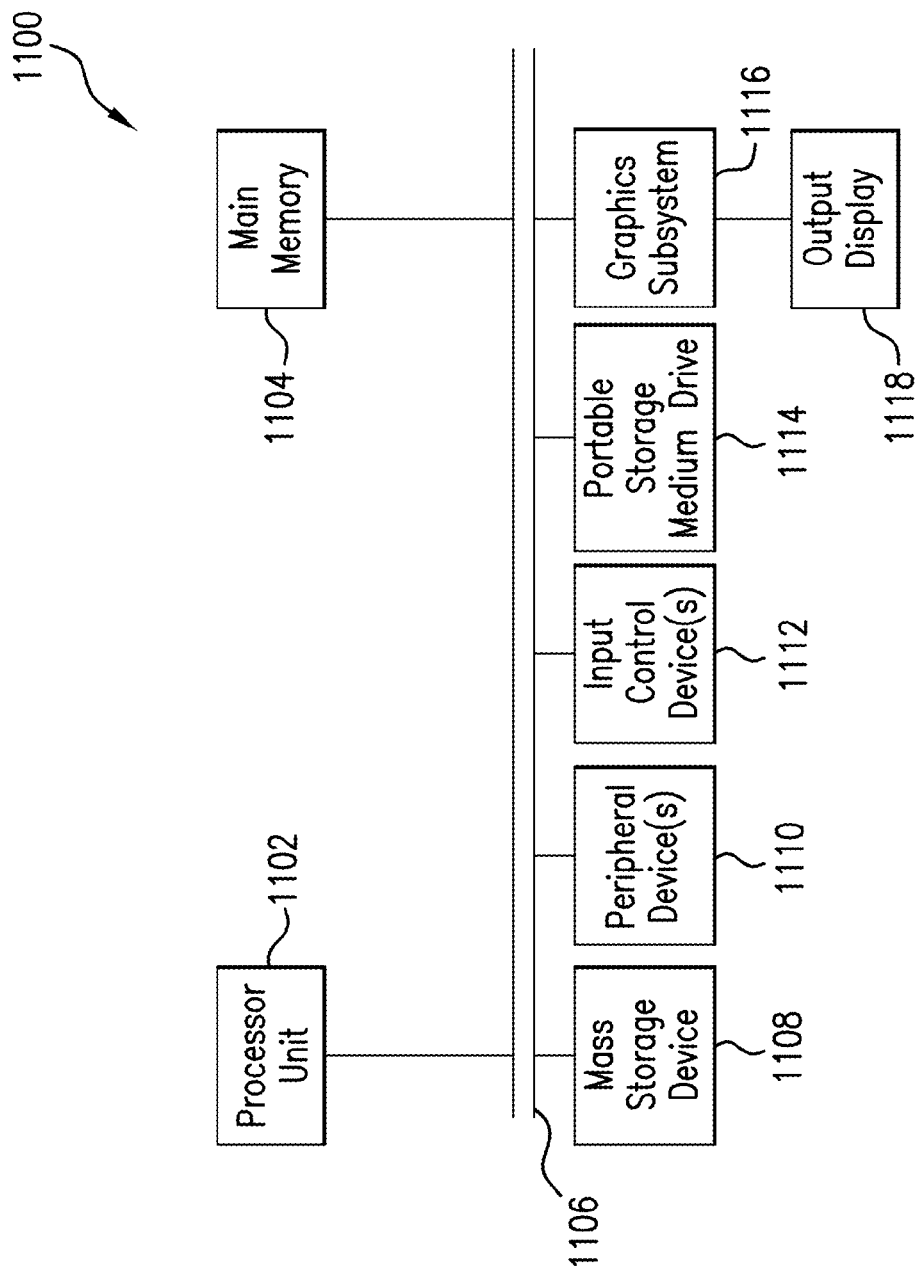

FIG. 11 illustrates a block diagram of a computer system for executing electronic design automation and integrated development environment debugging, in accordance with various embodiments of the present invention. A computer system 1100 contains a processor unit 1102, a main memory 1104, an interconnect bus 1106, a mass storage device 1108, peripheral device(s) 1110, input control device(s) 1112, portable storage drive(s) 1114, a graphics subsystem 1116, and an output display 1118. Processor unit 1102 may include a single microprocessor or a plurality of microprocessors for configuring computer system 1100 as a multi-processor system. Main memory 1104 stores, in part, instructions and data to be executed by processor 1102. Main memory 1104 preferably includes banks of dynamic random access memory (DRAM) as well as high-speed cache memory.

For the purpose of simplicity, the components of computer system 1100 are connected via interconnect bus 1106. However, computer system 1100 may be connected through one or more data transport means. For example, processor unit 1102 and main memory 1104 may be connected via a local microprocessor bus and mass storage device 1108, peripheral device(s) 1110, portable storage medium drive(s) 1114, and graphic subsystem 1116 may be connected via one or more input/output (I/O) busses. Mass storage device 1108, which may be implemented with a magnetic disk drive, an optical disk drive, a solid state device, an attachment to network storage, and the like, is preferably a non-volatile storage device for storing data, databases, and instructions, to be used by processor unit 1102. In a software embodiment, mass storage device 1108 may store the software to load it into main memory 1104.

Portable storage medium drive 1114 operates in conjunction with a portable non-volatile storage medium such as a floppy disk, a compact disk read only memory (CD-ROM), or a digital versatile disk read only memory (DVD-ROM), to input and output data and code to and from the computer system 1100. In one embodiment, the software is stored on such a portable medium, and is input to computer system 1100 via portable storage medium drive 1114. Peripheral device(s) 1110 may include any type of computer support device such as an input/output (I/O) interface, to add additional functionality to computer system 1100. For example, peripheral device(s) 1110 may include a network interface card to interface computer system 1100 to a network.

Input control device(s) 1112 provide a portion of the user interface for a computer system 1100 user. Input control device(s) 1112 may include an alphanumeric keypad for inputting alphanumeric and other key information; and a cursor control device such as a mouse, a track pad or stylus; or cursor direction keys.

In order to display textual and graphical information, computer system 1100 contains graphic subsystem 1114 and output display(s) 1118. Output display 1118 may include a cathode ray tube (CRT) display, liquid crystal display (LCD), plasma display, projector, or the like. Graphic subsystem 1116 receives textual and graphical information and processes the information for output to display 1118.

In a software implementation, the EDA software includes a plurality of computer executable instructions, to be implemented on a computer system. Prior to loading in the computer system, the EDA software may reside as encoded information on a computer-readable tangible medium such as a magnetic floppy disk, a magnetic tape, CD-ROM, DVD-ROM, flash memory, or any other suitable computer readable medium.

In a hardware implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

Thereby a designer with minimal effort, expended time, reduced chance of errors, and reduced costs may have an automated system and method for debugging Component Description Format (CDF) files, source code, and callback functions.

Although this invention has been described in connection with specific forms and embodiments thereof, it will be appreciated that various modifications other than those discussed above may be resorted to without departure from the spirit or scope of the invention. For example, equivalent elements, programming languages, applications, and formats may be substituted for those specifically shown and described, certain features may be used independently of other features, and in certain cases, particular combinations of circuit design and implementation flows or processing steps may be reversed or interposed, all without departing from the spirit or scope of the invention as defined in the appended Claims.

What is claimed is:

1. A computer-implemented method for automatically establishing a debugging interface of a computer program operable to execute a set of object functions comprising:
   providing a storage memory storing a source code for a plurality of objects, each object having at least one parameter component, each parameter component being modifiable through execution of a corresponding object function configured to have write access to the parameter component;
   establishing a user interface operably coupled to the storage memory and operable to display parameter components of each object;
   actuating the user interface to acquire a user selection of an object parameter component of interest;
   actuating a computer processor responsive to the user selection of the object parameter component of interest to:
      selectively map the selected object parameter component to an object function corresponding thereto;
      selectively locate, in the storage memory, a portion of source code referencing the object function mapped for the selected object parameter component of interest;
      automatically reconfigure the located source code portion referencing the object function to include a breakpoint placed therein with respect to the object function, wherein the breakpoint arrests normal execution in accordance with the source code thereat;
      execute according to the reconfigured source code referencing the object function;
   capturing a system state related to the object; and,
   displaying a debugging interface to the user including at least a portion of the system state related to the object.

2. The method as recited in claim 1, the debugging user interface being further operable to allow the user to manipulate a progression of the execution of the object function.

3. The method as recited in claim 2, further comprising: displaying the source code of the object function including indicia of a current position of the execution thereof.

4. The method as recited in claim 3, further comprising: identifying the set breakpoint and automatically removing the set breakpoint responsive to a user command to close debugging.

5. The method as recited in claim 1, further comprising: modifying the set breakpoint to arrest execution of the object function conditionally, responsive to a positive determination that execution of the object function is related to the selected object parameter component.

6. The method as recited in claim 1, further comprising: displaying a system state including at least one of an object parameter component value to a user.

7. A computer-implemented method for automatically establishing a debugging breakpoint for a computer program operable to instantiate a cell object in an electronic design automation (EDA) layout comprising:
- providing a memory selectively maintaining a source code defining at least one cell object of an EDA design, each cell object having at least one parameter component and at least one parameter setting function, each parameter component being modifiable through execution of the parameter setting function configured to have write-access to the parameter component;
- providing a user interface operably coupled to the memory and operable to display parameter components of each cell object and further operable to receive a user selection of at least one of the parameter components;
- actuating the user interface to accept a user selection of at least one of the parameter components;
- actuating a computer processor responsive to the user selection to:
  - selectively map the selected parameter component to a parameter setting function corresponding thereto;
  - selectively locate, in the memory, a portion of source code referencing the parameter setting function mapped for the selected parameter component;
  - establish a breakpoint placed in the source code portion to reference the located parameter setting function of the selected parameter component; and,
  - arrest execution of the computer program at the placed breakpoint referencing the parameter setting function for debugging by the user thereat.

8. The method as recited in claim 7, wherein the method further comprises rendering the breakpoint inoperative relative to the selected parameter component upon a positive determination that debugging has terminated.

9. The method as recited in claim 8, wherein the method further comprises removing the breakpoint upon a positive determination that the breakpoint is not operative for any remaining parameter components.

* * * * *